(12) United States Patent
Inomata

(10) Patent No.: US 7,233,077 B2
(45) Date of Patent: Jun. 19, 2007

(54) SEMICONDUCTOR DEVICE

(75) Inventor: Daisuke Inomata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 40 days.

(21) Appl. No.: 10/736,694

(22) Filed: Dec. 17, 2003

(65) Prior Publication Data
US 2005/0051909 A1 Mar. 10, 2005

(30) Foreign Application Priority Data
Sep. 10, 2003 (JP) ............................ 2003-318501

(51) Int. Cl.
*H01L 23/544* (2006.01)
(52) U.S. Cl. .................................................. 257/797
(58) Field of Classification Search ................ 257/797
See application file for complete search history.

(56) References Cited

U.S. PATENT DOCUMENTS 6,399,256 B1    6/2002   Ueno

FOREIGN PATENT DOCUMENTS

| JP | 2000133572 | 5/2000 |
| JP | 2000150358 | 5/2000 |
| JP | 2000-171966 | 6/2000 |
| JP | 2002064055 A * | 2/2002 |

* cited by examiner

*Primary Examiner*—Leonardo Andujar
(74) *Attorney, Agent, or Firm*—Volentine & Whitt, P.L.L.C.

(57) ABSTRACT

A semiconductor device includes a substrate which has a main surface and an alignment mark which is formed on the main surface and which has a pattern, wherein the pattern in a plane view has a shape that is obtained by eliminating corners from a polygon.

18 Claims, 4 Drawing Sheets

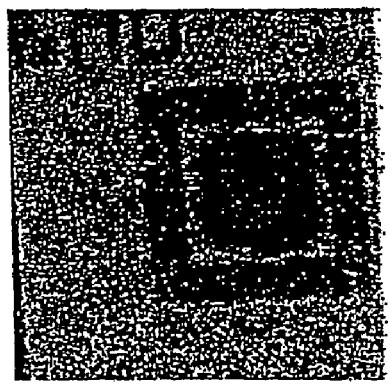
FIG. 6A
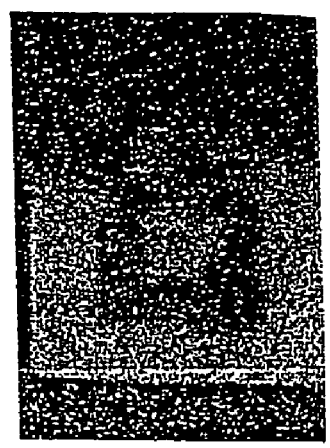
FIG. 6B
FIG. 7
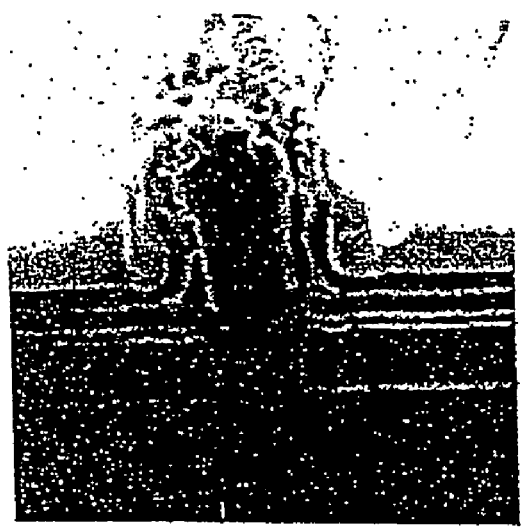

SEMICONDUCTOR DEVICE

BACKGROUND OF THE INVENTION

1. Field of the Invention

The present invention relates to a semiconductor device, and more particularly, to a semiconductor device including an alignment mark used in a photolithography process.

This application is counterpart of Japanese patent application, Serial Number 318501/2003, filed Sep. 10, 2003, the subject matter of which is incorporated herein by reference.

2. Description of the Related Art

Conventionally, a metal oxide ferrodielectric substance (hereinafter referred to as a ferrodielectric substance) and a metal oxide paradielectric substance (hereinafter referred to as a high-dielectric substance; in this specification, a paradielectric material having a dielectric constant of about 10 or more is referred to as a high-dielectric substance) are used for a semiconductor device. A semiconductor device using the ferrodielectric substance will be mainly described in the following.

In the semiconductor device using the ferrodielectric substance, a semiconductor device using a Bi (bismuth) layer-shaped compound of $SrBi_2Ta_2O_9$ (hereinafter, a substance having a varied composition of this substance and a series of additive represented by Nb (niobium) to or for this substance are referred to as SBT) or lead zirconate titanate $Pb(Zr_{1-x}Ti_x)O_3$ (hereinafter, a substance having a varied composition of this substance and a series of groups of compounds produced by adding an additive represented by La (lanthanum) or Ca (calcium) to this substance are referred to as PZT) has been brought into practical use. Then, ferrodielectric substances in the studying stage include such a substance referred to as BLT that is produced by adding La (lanthanum) to bismuth titanate and a solid solution of the ferrodielectric substance described above and the other dielectric substance. In any cases, there is such a common thing that the substances need to be subjected to a heat treatment in an oxygen atmosphere so as to show a ferrodielectric property as an oxide crystal and the invention can produce an equivalent effect. Thus, a case where a ferrodielectric film, in particular, an SBT film is used will be described in the following description.

All of the ferrodielectric substances including the SBT are metal oxide crystals and need to be subjected to a heat treatment at as high a temperature as from 600° C. to 800° C. so as to recover process damage caused at the time of crystallizing these substances and sputtering or etching the substances in the later processes. In addition, in many cases, this heat treatment is performed in an oxygen atmosphere. For this reason, in a case where a semiconductor device manufactured before forming a ferrodielectric capacitor has a wiring and a contact construction formed of W, the wiring and the contact construction are easily oxidized in the oxygen atmosphere to lose conductivity. Thus, it is necessary to take some countermeasure to prevent the oxidation of them.

On the other hand, the semiconductor device including the above-mentioned dielectric substances is manufactured by a photolithography process. Then, in this process, it is necessary to overlay (align) a pattern to be formed hereafter on (with) a pattern formed on an underlying layer with high accuracy. Thus, in addition to a device pattern, a pattern for constructing an alignment mark that only aims to perform the alignment with high accuracy are also formed at the same time. The alignment mark is broadly divided into three kinds of marks of a mark for rough alignment (search mark) and a mark for fine alignment (fine mark) both of which when a resist (photosensitive agent) is exposed to light by the use of a pattern exposure system, are read by the pattern exposure system and a mark for alignment and measurement that is used for detecting the amount of deviation from alignment by the use of an alignment measurement instrument after the resist is exposed to light and developed. These alignment marks are not directly related to the function of the semiconductor device but are necessary and indispensable at the time of manufacturing the semiconductor device.

There are three main alignment marks, as described above, and problems of the respective alignment marks and measures to solve the problems are the same for the three alignment marks. Thus, the mark for alignment and measurement will be described in the following. FIGS. 5A and 5B are schematic views of a typical structure of the mark for alignment and measurement of a conventional semiconductor device. FIG. 5A shows a schematic plan view of the mark for alignment and measurements, and FIG. 5B shows a cross sectional view taken on a line 5B—5B in FIG. 5A, the mark for alignment and measurement is formed of two patterns of an OUT-BOX 900 and an IN-BOX 910. The pattern shape of the OUT-BOX 900 is formed in a rectangular outside shape having a specified width and the pattern shape of the IN-BOX 910 is formed in a rectangular shape. The IN-BOX 910 is arranged inside the OUT-BOX 900.

For example, let's think a case where a second pattern layer yet to be formed is aligned with a first pattern layer of an underlying layer. First, the OUT-BOX 900 is formed of the first pattern layer and then the IN-BOX 910 is formed in a lithography process of the second pattern layer. Here, for example, let's assume that the IN-BOX 910 of the second pattern layer is formed of a resist. By measuring the marks for alignment and measurement constructed of the OUT-BOX 900 and the IN-BOX 910 by means of an alignment measurement instrument, the amount of deviation from alignment of the first pattern layer relative to the second pattern layer is detected. In a case where the amount of deviation from alignment is larger than a specified value, the resist is totally removed and another second pattern layer is again formed by the use of the obtained alignment correction value. Here, conversely, in a case where the IN-BOX 910 is formed of the first pattern layer, the OUT-BOX 900 is formed of the second pattern layer and then the amount of deviation from alignment is detected in the same way. In both cases, the same following operations will be performed.

FIG. 5A is a drawing corresponding to a case where the first pattern layer is a layer in which a contact hole is formed and where the OUT-BOX is simultaneously formed at the time of etching the contact hole and where the IN-BOX is formed in the following process. The structure shown in FIG. 5B is manufactured by the method to be described below. First, a contact hole is formed in an interlayer insulation film 901 in a contact hole etching process. Then, a barrier metal is formed of, for example, Ti/TiN (titan/titan nitride). Then, a tungsten film (hereinafter referred to as "W film") is formed by a tungsten chemical vapor deposition method (hereinafter referred to as "W-CVD method"). In the barrier metal and the W film, a metal film 902 is formed only inside the contact hole by the use of an etch back method or a chemical mechanical polishing method (hereinafter referred to as "CMP method"). At this time, in a case where the etch back method is used, as shown in FIG. 5B, a metal layer remains in the shape of a side wall in a mark region and in a case where the CMP method is used, the metal layer remains in the more expanded region. Thereafter, an interlayer insulation film 903 is formed and the IN-BOX is formed of the second pattern layer. A silicon nitride film, for example, is used for the interlayer insulation film 903. Alternatively, in some case, the first pattern layer is formed and then a capacitor electrode is directly formed without forming the interlayer insulation film 903. In this case, the insulation film 903 shown in FIG. 5B becomes a capacitor electrode film.

Even if the stepped portions formed in the shape of side wall are covered with the silicon nitride film or the capacitor electrode film, as shown in FIG. 5B, W (tungsten) is heavily oxidized to deform the shape of the alignment mark, as shown in FIGS. 6A and 6B, by the heat treatment performed in the oxygen atmosphere at the time of forming the ferrodielectric substance. FIG. 6A shows an example of deformed shape of the IN-BOX and FIG. 6B shows an example of deformed shape of the OUT-BOX. Both of them are photographs taken with an optical microscope. When the alignment mark is deformed in the shape, a function as the alignment mark is not performed, and further very serious problems in manufacturing the semiconductor device such as the occurrence and separation of particles in the following processes are caused. Moreover, FIG. 7 shows a photograph of cross section of an alignment mark portion oxidized by a focused ion beam (hereinafter referred to as "FIB") and shows a state where the W film is oxidized and expanded to break the upper layer film.

Among publicly known documents relating to the present invention is the patent document 1 described below. In the patent document 1 is described a technology of replacing an accessory pattern of a pattern other than a semiconductor integrated circuit by a set of a plural constituent patterns.
[Patent Document 1] JP-A-2000-171966

In addition to the above-mentioned problems of oxidation and separation of the alignment mark portion, in the pattern shape of the OUT-BOX 900 shown in FIGS. 5A and 5B whose outside shape is rectangular, there is presented a problem that since the pattern widths of the corner portions become larger than the pattern widths of the sides portions, voids are apt to occur at the corner portions. The occurrence of voids results in increasing the amount of etch back or CMP when the W etch back or the W-CMP is performed in the later process and hence causes a reduction in uniformity in the plane of a wafer.

SUMMARY OF THE INVENTION

Thus, the present invention has been made in view of the problems described above. It is the object of the invention to provide a newly developed and improved semiconductor device that has a function of an alignment mark and that can solve a problem of occurrence of voids in the region of the alignment mark.

In order to solve the above problems, according to one aspect of the invention, there is provided a semiconductor device that includes a substrate which has a main surface and an alignment mark which is formed on the main surface and which has a pattern, wherein the pattern in a plane view has a shape that is obtained by eliminating corners from a polygon.

According to this construction, the pattern of the alignment mark is formed in the shape in which corners apt to cause voids are eliminated and hence can solve such a problem of occurrence of voids that is presented by the conventional art. Moreover, according to this construction, deviations from alignment can be detected by the use of the linear patterns constructing the sides of the above-mentioned polygon, so this construction can perform also a function as the alignment mark At this time, if the polygon is a rectangle, the rectangle is a simple shape and hence can be easily formed and further two-dimensional deviations from alignment in the plane parallel to the plane of the substrate can be easily detected by the use of a pattern corresponding to two sides intersecting at right angles of the rectangle. Moreover, it is preferable that the width of the pattern of the alignment mark ranges from 0.6 μm to 0.8 μm. If the width of the pattern is less than 0.6 μm, it hampers measuring alignment with high accuracy. If the width of the pattern is 0.8 μm or more, the thickness of a W film at the time of performing the W-CVD needs to be about 0.6 μm or more and in consideration of variations in the thickness in the plane of the wafer at the time of performing the etch back or the CMP, about 0.8 μm is thought to be the upper limit value of the width of the pattern.

Moreover, it is preferable that the above-mentioned semiconductor device includes a metal film constructing the pattern of the alignment mark and a cover film that is formed over the metal film to prevent the oxidation of the metal film. According to this construction, it is possible to prevent the oxidation and separation of the metal film constructing the alignment mark by the cover film. Thus, the alignment mark is not deformed but can perform a function as the alignment mark.

It is preferable that a pattern of the cover film in a plane parallel to a plane of the substrate is formed in a shape formed of such sides of a polygon that are obtained bye liminating corners from the polygon. Usually, while the cover film is formed over an insulation film, the cover film has a poor contact with this underlying insulation film and if the cover film is deposited in an expanded area over the insulation film, the cover film is apt to separate in the later process. Thus, as described above, by forming the cover film in the same shape of pattern as the metal film and in a minimal area necessary for covering the metal film, it is possible to produce effects of keeping resistance to oxidation and, at the same time, of preventing separation in the later process.

It is preferable that the width of the pattern of the above-mentioned cover film is 1 μm to several μm wider in one side than the width of the pattern formed of the metal film. According to this construction, it is possible to provide an appropriate covered area and hence to produce effects of keeping resistance to oxidation and, at the same time, of preventing separation in the later process.

Moreover, it is preferable that the cover film is formed of iridium-based metal. The iridium-based metal can be also the material of the lower electrode of a ferrodielectric capacitor and hence in the case of adopting the iridium-based metal, it is possible to form both of the cover film and the lower electrode in one process.

As described above, according to the invention, there is provided a semiconductor device that has a function of an alignment mark and that can solve such a problem of occurrence of voids in the alignment mark region that is presented by the conventional art.

BRIEF DESCRIPTION OF THE DRAWINGS

FIG. 1A is a schematic plan view, FIG. 1B is a cross sectional view taken along a line 1B—1B in FIG. 1A, and FIG. 1C is a cross sectional view taken along a line 1C—1C in FIG. 1A.

FIG. 5A is a schematic plan view, and FIG. 5B is a cross sectional view taken along a line 5B—5B in FIG. 5A.

FIGS. 6A and 6B are photoaraphs, taken with an optical microscope, of such an alignment mark of a conventional semiconductor device that is deformed into a faulty shape by oxidation. FIG. 6A is an example relating to an IN-BOX and FIG. 6B is an example relating to an OUT-BOX.

FIG. 7 is a cross sectional photograph, taken with FIB, of such an alignment mark of a conventional semiconductor device that is deformed into a faulty shape by oxidation.

DESCRIPTION OF THE PREFERRED EMBODIMENTS

The preferred embodiments of the invention will be described below in detail with reference to the accompanying drawings. Here, in the present specification and the drawings, the constituent elements having substantially same functional constructions will be designated by the same reference symbols and the duplication of their descriptions will be omitted.

A semiconductor device in accordance with a typical embodiment of the invention is formed on a substrate and includes alignment marks. The shape of pattern of each alignment mark in a plane parallel to the surface of the substrate is formed in a shape formed of such sides of a polygon that are obtained by eliminating corners from the polygon. This pattern of the alignment mark is constructed of a metal film. Then, in the semiconductor device in accordance with the typical embodiment of the invention, a cover film for preventing the oxidation of the metal film is formed over the metal film.

Figure 1A:
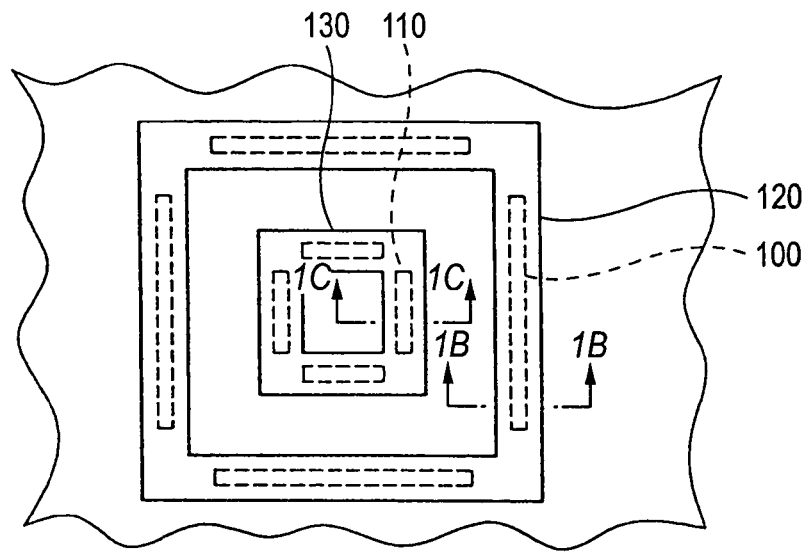
FIGS. 1A–1C showing the construction of an alignment mark of a semiconductor device in accordance with the first embodiment of the present invention.
Figure 1B:
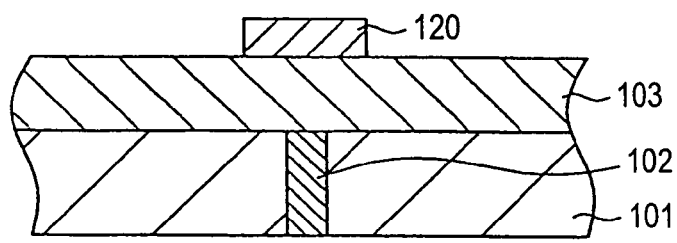
Figure 1C:
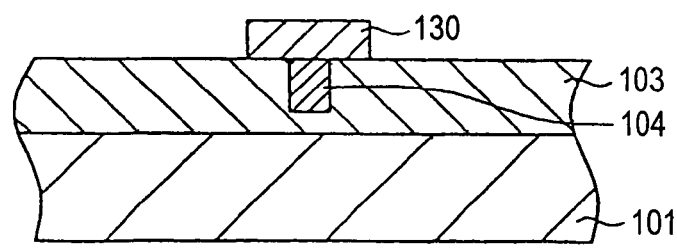

A semiconductor device in accordance with the first embodiment of the invention will be described with reference to FIGS. 1A–1C. This semiconductor device is formed on a substrate and includes an alignment mark. FIGS. 1A–1C show the construction of the alignment mark. FIG. 1A is a schematic plan view and FIG. 1B is a cross sectional view taken along a line 1B—1B in FIG. 1A and FIG. 1C is a cross sectional view taken along a line 1C—1C in FIG. 1A. The semiconductor device in the present embodiment includes alignment marks of an OUT-LINE 100 and an IN-LINE 110. The pattern shape of each of alignment marks of the OUT-LINE 100 and the IN-LINE 110 in a plane parallel to the plane of the substrate is formed in a shape including four sides obtained by eliminating four corners from a rectangle. However, the rectangle on which the pattern shape of the IN-LINE 110 is based on is smaller the rectangle on which the pattern shape of the OUT-LINE 100 is based and the IN-LINE 110 is located inside the OUT-LINE 100. All of the patterns constructing the OUT-LINE 100 and the IN-LINE 110 have a uniform width ranging from 0.6 μm to 0.8 μm and are formed of metal films, respectively, as will be described later.

Then, cover films 120, 130 that cover the OUT-LINE 100 and the IN-LINE 110 to prevent the oxidation of these metal films are formed over the OUT-LINE 100 and the IN-LINE 110, respectively. The cover films 120, 130 are formed in a pattern shape whose outside shape is rectangular and are formed of iridium-based metal, respectively. Then, each of the cover films 120, 130 is formed in such away that it is 1 μm to several μm wider in one side than the width of each of the pattern of the OUT-LINE 100 and the IN-LINE 110 covered by the cover film 120 and 130. Here, the cover film is formed in such a way that it is 1 μm wider in one side, or 2 μm wider in both sides than the width of the pattern of the OUT-LINE 100 or the IN-LINE 110.

The alignment marks shown in FIGS. 1A–1C are marks for alignment and measurement and are used in a case where a first pattern layer of an underlying layer is aligned with a second pattern layer to be formed hereafter. For example, the first pattern layer forms the OUT-LINE 100 and then the second pattern layer forms the IN-LINE 110. By measuring the marks for alignment, constructed of the OUT-LINE 100 and the IN-LINE 110, by means of an alignment measurement instrument, the amount of deviation from alignment of the first pattern layer relative to the second pattern layer is detected. In a case where the amount of deviation from alignment is larger than a specified value, the second pattern layer is totally removed and then another second pattern is formed by the use of an obtained alignment correction value.

Next, an example of a method for making a structure shown, in FIG. 1B and FIG. 1C will be described. First, a contact hole is formed in an interlayer insulation film 101 in a contact hole etching process and then a metal film 102 of a W (tungsten) film or the like is formed by a CVD method. In this manner, the OUT-LINE 100 is formed in a trench width ranging from about 0.6 μm to 0.8 μm in the region of alignment mark. Then, an interlayer insulation film 103 is deposited thereon. Thereafter, in a process for aligning with the OUT-LINE 100, the IN-LINE 110 is formed of a photoresist and then a deviation from alignment is checked. Here, as is the case with the OUT-LINE 100, the IN-LINE 110 is also formed in a narrow trench width ranging from about 0.6 μm to 0.8 μm in the insulation film 103. Next, the insulation film 103 is etched by using the IN-LINE 110 as a resist pattern and further a metal film 104 of W or the like is formed by the CVD method and then the metal film other than the metal film inside the contact hole is removed by a whole surface etch back method or a CMP method. In this respect, while the OUT-LINE 100 is formed and then the IN-LINE 110 is formed in the above manner, it is also possible to interchange the order of forming the OUT-LINE 100 and the IN-LINE 110.

Thereafter, the cover films 120, 130 of barriers to oxygen are deposited over the alignment marks in such a way that they are wider than the trench widths of the alignment marks, for example, by +1 μm to +several μm. Here, iridium-based metal is used as the material of the cover films 120, 130.

The alignment mark of the present embodiment is formed in a pattern shape formed of sides obtained by eliminating four corners from a rectangular contour. That is, the alignment mark has a shape constructed of linear patterns obtained by cutting four corners from the rectangular contour. As will be described later by the use of a comparative embodiment, in the case of a pattern shape whose contour is a rectangle having four corners, the pattern width of each corner portion becomes $\sqrt{2}$ times the pattern width of a side portion. Thus, in this case, there are produced portions where the pattern width is different from the side portion and voids are apt to occur at these portions. However, in the pattern shape of the alignment mark in the present embodiment, the portions having a different pattern width are eliminated and hence the pattern widths of the alignment marks become uniform, which can essentially prevent, the occurrence of voids caused conventionally at the time of performing the W-CVD by the related art. This pattern shape does not interfere with alignment and measurement which are essential objects but can keep a function as an alignment mark. Moreover, the adoption of the rectangular pattern shape makes it possible to easily detect two-dimensional deviation from alignment in a plane parallel to the plane of the substrate by the use of a pattern corresponding to two sides of a rectangle intersecting at right angles.

Figure 5A:
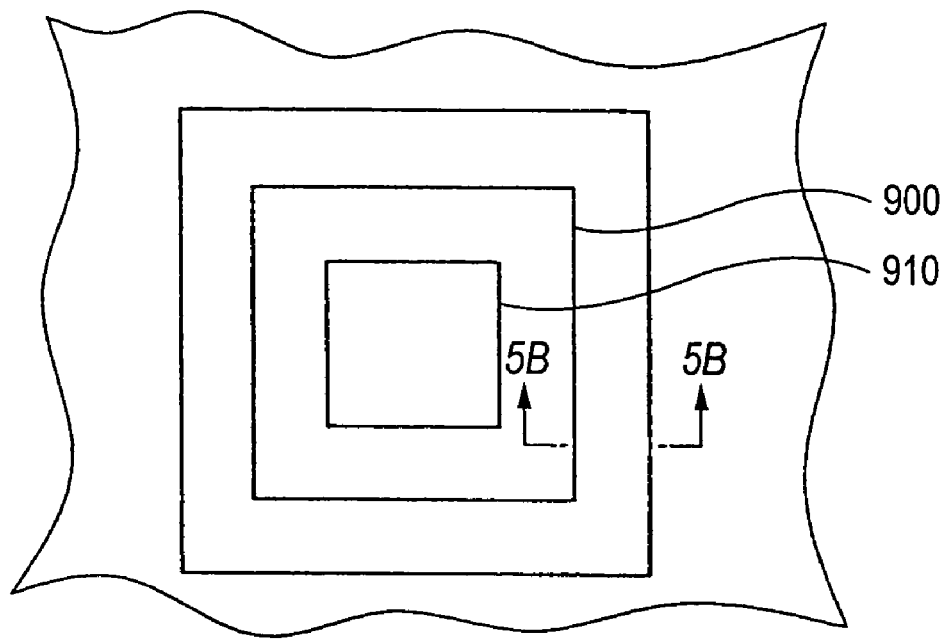
FIGS. 5A and 5B are illustrations showing the construction of an alignment mark of a conventional semiconductor device.
Figure 5B:
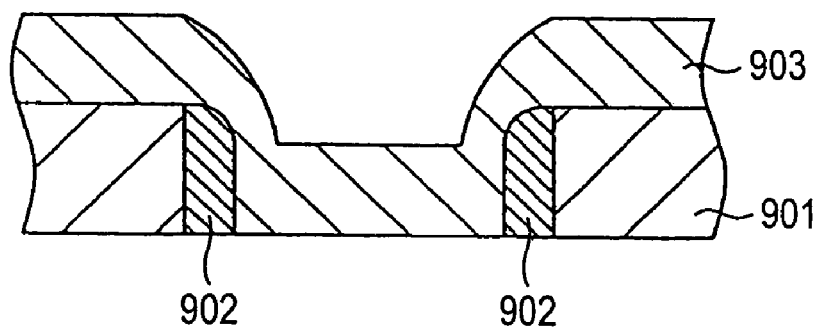

Further, in the present embodiment, all of the pattern widths of the OUT-LINE 100 and the IN-LINE 110 are uniform and range from 0.6 µm to 0.8 µm. In the present embodiment, forming the pattern widths in such a narrow range makes it possible to bury the trenches by metal and thus to eliminate the stepped shape shown in FIG. 5B at the portion of the alignment mark. In the related art, even if a film for preventing oxidation is formed, the film is not formed in a good state in this stepped portion and hence can not prevent the diffusion of oxygen, thereby causing a problem of oxidation. However, in the present embodiment, the pattern shape is formed in such a narrow width to eliminate the stepped portion and hence can avoid such a problem. In this regard, a pattern width smaller than 0.6 µm interferes with measurement accuracy at the time of performing alignment and measurement and a pattern width of 0.8 µm or more requires increasing the thickness of the W film at the time of performing the W-CVD to 0.6 µm or more and hence in consideration of variations in the plane of the wafer at the time of performing the etch back or the CMP, a pattern width of about 0.8 µm is thought to be an upper limit value.

Still further, in the present embodiment, the formation of the cover films 120, 130 can prevent the oxidation and separation of the alignment mark which are conventionally caused in the related art. Thus, the alignment mark is not deformed but can perform a function as the alignment mark. The cover films 120, 130 are formed wider than the pattern widths of the OUT-LINE 100 and the IN-LINE 110 by from 1 µm to several µm in one side, respectively. Since the cover film has a poor contact with the underlying insulation film, if the cover film is deposited in a wide region on the insulation film, it is apt to separate in the following process, whereas if the cover film is deposited in too narrow a region, its function of preventing the oxidation of the alignment mark is reduced by the diffusion of oxygen. Therefore, the formation of the cover film in the width described above can produce an effect of keeping resistance to oxidation and at the same time resistance to the separation in the following process. Here, the iridium-based metal film is adopted as the material of the cover films 120, 130. Since the iridium-based metal can be also the material of lower electrode of a ferrodielectric capacitor, both of the cover film and the lower electrode can be formed of the iridium-based metal by one process.

Figure 2:
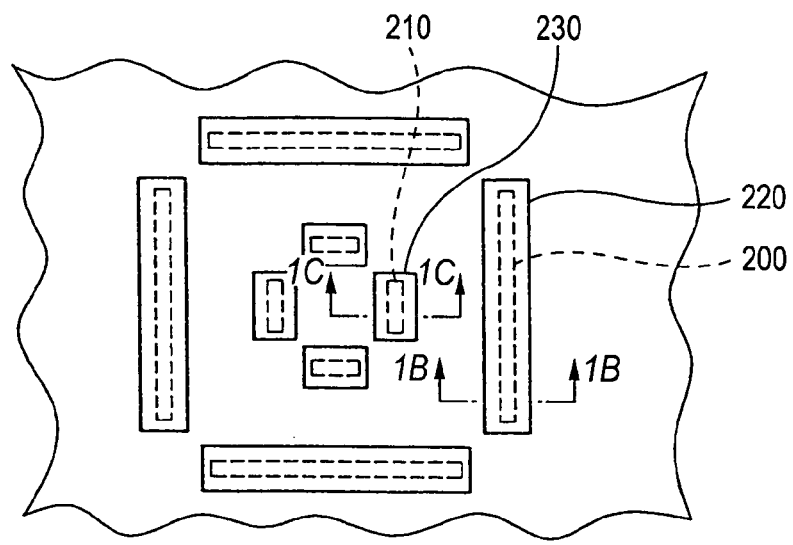
FIG. 2 is a schematic plan view showing the construction of an alignment mark of a semiconductor device in accordance with the second embodiment of the present invention.

Next, a semiconductor device in accordance with the second embodiment of the invention will be described with reference to FIG. 2. FIG. 2 is a schematic plan view showing the construction of the semiconductor device in accordance with the second embodiment of the invention. The present embodiment is different only in the pattern shape of a cover film from the first embodiment and is the same in the other portions as the first embodiment. The second embodiment will be described with attention paid to this point, and the duplicated description of the same portions as the first embodiment will be omitted.

An alignment mark in the present embodiment, as shown in FIG. 2, is constructed of patterns of an OUT-LINE 200 and an IN-LINE 210. The construction of shape and material of these patterns in the plane parallel to the surface of the substrate is the same as that of the OUT-LINE 100 and the IN-LINE 110 of the first embodiment. Then, the cross section along a line 1B-1B and the cross section along a line 1C—1C in FIG. 2 are the same as the construction in FIG. 1B and FIG. 1C. Then, the method of making them is the same as the method in the first embodiment.

Cover films 220 and 230 for preventing the oxidation of metal constructing the OUT-LINE 200 and the IN-LINE 210 are formed over the OUT-LINE 200 and the IN-LINE 210 so as to cover them. Each of the patterns of the cover films 220 and 230 in the plane parallel to the plane of the substrate is formed in a shape formed of four sides obtained bye liminating four corners from a rectangle. That is, each of the cover films 220 and 230 is formed in the same pattern shape as each of the OUT-LINE 200 and the IN-LINE 210, but is formed in such a way that it is 1 µm to several µm wider in one side than each of the pattern of the OUT-LINE 200 and the IN-LINE 210 covered by it.

Since the cover film has a poor contact with the underlying insulation film, if the cover film is deposited in a wide region on the insulation film, it is apt to separate in the following process, whereas if the cover film is deposited in too narrow a region, the function of the cover film of preventing the oxidation of the alignment mark is reduced by the diffusion of oxygen. Therefore, the formation of the cover film in a width which is 1 µm to several µm larger in one side than the pattern width of the metal film can produce an effect of keeping resistance to oxidation and at the same time resistance to the separation in the following process. In the present embodiment, in consideration of the above point, the pattern shape of the cover film is further improved and optimized. A stress analysis reveals that a stress concentration is most apt to occur in four corners of a rectangle. Then, also in an actual trial of the cover film, abnormalities such as floating film were observed at the four corners. Thus, the adoption of the pattern shape in which these four corners are cut off can keep a function of preventing the oxidation of the alignment mark and improve such adhesion of the cover film that becomes important in the following process, that is, improve an effect of preventing separation.

Figure 3:
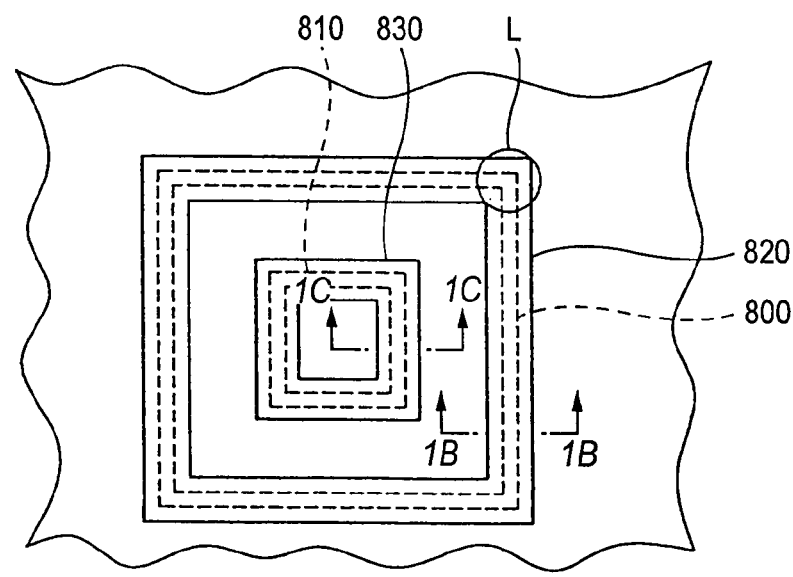
FIG. 3 is a schematic plan view showing the construction of an alignment mark of a conventional semiconductor device as a comparative embodiment.

FIG. 3 is a schematic plan view of a semiconductor device of a comparative embodiment to the second embodiment. The semiconductor device of the comparative embodiment has alignment marks and the alignment marks are constructed of an OUT-BOX 800 and an IN-BOX 810, respectively. Each of the OUT-BOX 800 and the IN-BOX 810 has a pattern shape whose outside shape is rectangular. Cover films 820 and 830 each having a pattern shape whose outside shape is rectangular and for preventing the oxidation of the OUT-LINE 800 and the IN-LINE 810 are formed over the OUT-BOX 800 and the IN-BOX 810 so as to cover them. That is, the pattern shape of the comparative embodiment shown in FIG. 3 corresponds to such that the alignment mark of the first embodiment is changed to a shape in which its four corners are note liminated. The other constructions of this comparative embodiment such as pattern width and material are the same as the first embodiment. Then, a cross section along a line 1B—1B and a cross section along a ling 1C—1C in FIG. 3 are the same as those in FIG. 1B and FIG.

1C shown in first embodiment and a method of making the alignment marks is the same as in the first embodiment.

Figure 4:
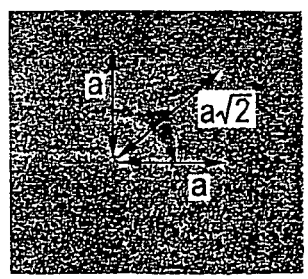
FIG. 4 is a photograph taken by a SEM and showing void produced in an L portion in FIG. 3.

In the comparative embodiment, the pattern widths of linear portions of the OUT-LINE 800 and the IN-LINE 810 are uniform but the pattern widths of the corners become $\sqrt{2}$ times those of the linear portions. The comparative embodiment has portions having such a larger pattern width and is not uniform in the pattern width and hence produces large voids at the time of performing the W-CVD. FIG. 4 is a photograph taken with a SEM (scanning electron microscope) and showing voids produced at a corner L in FIG. 3. A problem of producing such voids can be prevented to some extent if the thickness of a film formed by the W-CVD is increased to (a $\sqrt{2}$)/2 or more where a is the pattern width, but the corners essentially remain in a state where voids are apt to occur. The occurrence of voids increases the amount of etch back or the amount of CMP at the time of performing the etch back or the CMP, which results in causing a reduction in uniformity in the plane of a wafer.

While the preferred embodiments of the invention have been described with reference to the accompanying drawings, it is needless to say that the invention is not limited to these embodiments. It is clearly understood that persons skilled in the art come up with various alterations and modifications within the scope claimed by the appended claims. Naturally, it is understood that these various alterations and modifications also belong to the technical scope of the invention.

While cases where the invention is applied to the mark for alignment and measurement have been described as examples in the above embodiments, the invention can be applied to the other alignment marks such as a mark for rough alignment and a mark for fine alignment. Moreover, while the description has been made by taking a rectangle as an example of a polygon in the above embodiments, it is not intended to limit a polygon to a rectangle, but other polygonal shapes such as merely a square and a hexagon can be used.

The invention can be applied to both of a semiconductor device using a ferrodielectric substance and a semiconductor device using a high-dielectric substance. Moreover, the invention can be also applied to general semiconductor devices, for example, all kinds of semiconductor devices subjected to heat treatment in an oxygen atmosphere such as a process of forming a thermal oxidation film.

INDUSTRIAL APPLICABILITY

The invention can be applied to a semiconductor device and in particular, to a semiconductor device that has an alignment mark used in a photolithography process at the time of manufacturing a semiconductor device using a ferrodielectric substance or a metal oxide paradielectric substance.

What is claimed is:

1. A semiconductor device comprising:
   a substrate which has a main surface;
   an alignment mark which is formed on the main surface and which has a pattern, wherein the pattern in a plane view has a shape that is obtained by eliminating corners from a polygon; and
   strips of oxidation prevention cover film that are respectively aligned above the alignment mark, that are separated from each other, and that are disposed in the shape of the pattern.

2. The semiconductor device as claimed in claim 1, wherein the polygon is a rectangle.

3. The semiconductor device as claimed in claim 1, wherein a width of the pattern of the alignment mark ranges from 0.6 µm to 0.8 µm.

4. The semiconductor device as claimed in claim 1, wherein the alignment mark is a metal film.

5. The semiconductor device as claimed in claim 1, wherein a width of the strips oxidation prevention cover film is 1 µm to several µm wider at one side than a width of the pattern of the alignment mark.

6. The semiconductor device as claimed in claim 1, wherein the strips of oxidation prevention cover film are formed of iridium-based metal.

7. A semiconductor device comprising:
   a substrate which has a main surface;
   an alignment mark which is formed on the main surface and which has first through fourth mark portions, wherein the first through fourth mark portions are arranged in a pattern so that the first and second mark portions oppose each other, the third and fourth mark portions oppose each other, and the first through fourth mark portions are separated from one another; and
   first through fourth sections of oxidation prevention cover film respectively formed as separated from each other and aligned directly above the first through fourth mark portions in the pattern.

8. The semiconductor device as claimed in claim 7, wherein a width of the first through fourth mark portions of the alignment mark ranges from 0.6 µm to 0.8 µm.

9. The semiconductor device as claimed in claim 7, wherein the alignment mark comprises a metal film.

10. The semiconductor device as claimed in claim 7, wherein a width of the first through fourth sections of oxidation prevention cover film is 1 µm to several µm wider at one side than a width of the first through fourth mark portions of the alignment mark.

11. The semiconductor device as claimed in claim 7, wherein the oxidation prevention cover films are formed of iridium-based metal.

12. A semiconductor device comprising:
    a substrate having a main surface;
    an alignment mark on the main surface of the substrate, wherein the alignment mark is strip-like and has a shape of a polygon without corners along a plane parallel to the main surface of the substrate; and
    an oxidation prevention cover film aligned directly above the alignment mark, wherein the oxidation prevention cover film is a closed-loop strip and has the shape of the polygon.

13. The semiconductor device of claim 12, wherein the polygon is a rectangle.

14. The semiconductor device of claim 13, wherein the oxidation prevention cover film has rectangular shape.

15. The semiconductor device of claim 12, wherein the alignment mark has a width ranging from 0.6 µm to 0.8 µm.

16. The semiconductor device of claim 12, wherein a width of the oxidation prevention cover film is 1 µm to several µm wider than a width of the alignment mark.

17. The semiconductor device of claim 12, wherein the alignment mark is a metal film.

18. The semiconductor device of claim 12, wherein the oxidation prevention cover film is an iridium based metal.

* * * * *